(12) United States Patent
Khlat et al.

(10) Patent No.: US 10,193,502 B2
(45) Date of Patent: Jan. 29, 2019

(54) DUAL-MODE ENVELOPE TRACKING POWER MANAGEMENT CIRCUIT

(71) Applicant: Qorvo US, Inc., Greensboro, NC (US)

(72) Inventors: Nadim Khlat, Cugnaux (FR); Andrew F. Folkmann, Cedar Rapids, IA (US); Michael R. Kay, Summerfield, NC (US); Philippe Gorisse, Brax (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/433,246

(22) Filed: Feb. 15, 2017

(65) Prior Publication Data

US 2017/0250653 A1 Aug. 31, 2017

Related U.S. Application Data

(60) Provisional application No. 62/300,161, filed on Feb. 26, 2016.

(51) Int. Cl.
| | |
|---|---|
| *H03F 1/02* | (2006.01) |
| *H03F 3/21* | (2006.01) |
| *H03F 1/30* | (2006.01) |
| *H03F 3/19* | (2006.01) |
| *H03F 3/217* | (2006.01) |
| *H03F 3/45* | (2006.01) |

(52) U.S. Cl.
CPC .............. *H03F 1/0211* (2013.01); *H03F 1/30* (2013.01); *H03F 3/19* (2013.01); *H03F 3/211* (2013.01); *H03F 3/217* (2013.01); *H03F 3/45475* (2013.01); *H03F 2200/102* (2013.01); *H03F 2200/432* (2013.01); *H03F 2200/451* (2013.01); *H03F 2200/48* (2013.01); *H03F 2203/21136* (2013.01); *H03F 2203/21181* (2013.01); *H03F 2203/45138* (2013.01)

(58) Field of Classification Search
USPC ................. 330/296–297, 127, 129, 134, 279
See application file for complete search history.

(56) References Cited

U.S. PATENT DOCUMENTS 9,098,099 B2 * 8/2015 Park ...................... H03F 1/0227

* cited by examiner

*Primary Examiner* — Hieu Nguyen
(74) *Attorney, Agent, or Firm* — Withrow & Terranova, P.L.L.C.

(57) ABSTRACT

A dual-mode envelope tracking (ET) power management circuit is provided. An ET amplifier(s) in the dual-mode ET power management circuit is capable of supporting normal-power user equipment (NPUE) mode and high-power user equipment (HPUE) mode. In the NPUE mode, the ET amplifier(s) amplifies a radio frequency (RF) signal(s) to an NPUE voltage based on a supply voltage for transmission in an NPUE output power. In the HPUE mode, the ET amplifier(s) amplifies the RF signal(s) to an HPUE voltage higher than the NPUE voltage based on a boosted supply voltage higher than the supply voltage for transmission in an HPUE output power higher than the NPUE output power. The ET amplifier(s) maintains a constant load line between the NPUE mode and the HPUE mode. By maintaining the constant load line, it is possible to maintain efficiency of the ET amplifier(s) in both the NPUE mode and the HPUE mode.

20 Claims, 7 Drawing Sheets

DUAL-MODE ENVELOPE TRACKING POWER MANAGEMENT CIRCUIT

RELATED APPLICATIONS

This application claims the benefit of U.S. Provisional Patent Application Ser. No. 62/300,161, filed on Feb. 26, 2016, which is incorporated herein by reference in its entirety.

FIELD OF THE DISCLOSURE

The technology of the disclosure relates generally to power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rate offered by wireless communication technologies, such as long-term evolution (LTE). To achieve the higher data rate in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of the PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the RF PAs are operating at a higher efficiency for a given instantaneous output power requirement of the RF signals. In this regard, efficiency of the envelope tracking system can impact overall power consumption and performance of the mobile communication devices.

SUMMARY

Aspects disclosed in the detailed description include a dual-mode envelope tracking (ET) power management circuit. An ET amplifier(s) in the dual-mode ET power management circuit is capable of supporting a normal-power user equipment (NPUE) mode and a high-power user equipment (HPUE) mode. In the NPUE mode, the ET amplifier(s) amplifies a radio frequency (RF) signal(s) to an NPUE voltage based on a supply voltage for transmission in an NPUE output power. In the HPUE mode, the ET amplifier(s) amplifies the RF signal(s) to an HPUE voltage higher than the NPUE voltage based on a boosted supply voltage higher than the supply voltage for transmission in an HPUE output power higher than the NPUE output power. The ET amplifier(s) maintains a constant load line between the NPUE mode and the HPUE mode. By maintaining the constant load line, it is possible to maintain efficiency of the ET amplifier(s) in both the NPUE mode and the HPUE mode.

In one aspect, a dual-mode ET power management circuit is provided. The dual-mode ET power management circuit includes at least one ET amplifier having a preconfigured load line and configured to support an NPUE mode and an HPUE mode. In the NPUE mode, the at least one ET amplifier is further configured to amplify at least one RF signal to an NPUE voltage based on a supply voltage to cause the at least one RF signal being transmitted from an RF transmission circuit at an NPUE output power in an NPUE RF spectrum. In the HPUE mode, the at least one ET amplifier is further configured to amplify the at least one RF signal to an HPUE voltage higher than the NPUE voltage based on a boosted supply voltage higher than the supply voltage to cause the at least one RF signal being transmitted from the RF transmission circuit at an HPUE output power higher than the NPUE output power in an HPUE RF spectrum. The dual-mode ET power management circuit also includes a power management circuit. The power management circuit is configured to provide the supply voltage to the at least one ET amplifier when the at least one ET amplifier operates in the NPUE mode. The power management circuit is also configured to provide the boosted supply voltage to the at least one ET amplifier when the at least one ET amplifier operates in the HPUE mode. The preconfigured load line of the at least one ET amplifier is maintained constant between the NPUE mode and the HPUE mode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Aspects disclosed in the detailed description include a dual-mode envelope tracking (ET) power management circuit. An ET amplifier(s) in the dual-mode ET power management circuit is capable of supporting a normal-power user equipment (NPUE) mode and a high-power user equipment (HPUE) mode. In the NPUE mode, the ET amplifier(s) amplifies a radio frequency (RF) signal(s) to an NPUE voltage based on a supply voltage for transmission in an NPUE output power. In the HPUE mode, the ET amplifier(s) amplifies the RF signal(s) to an HPUE voltage higher than the NPUE voltage based on a boosted supply voltage higher than the supply voltage for transmission in an HPUE output power higher than the NPUE output power. The ET amplifier(s) maintains a constant load line between the NPUE mode and the HPUE mode. By maintaining the constant load line, it is possible to maintain efficiency of the ET amplifier(s) in both the NPUE mode and the HPUE mode.

Figure 1A:
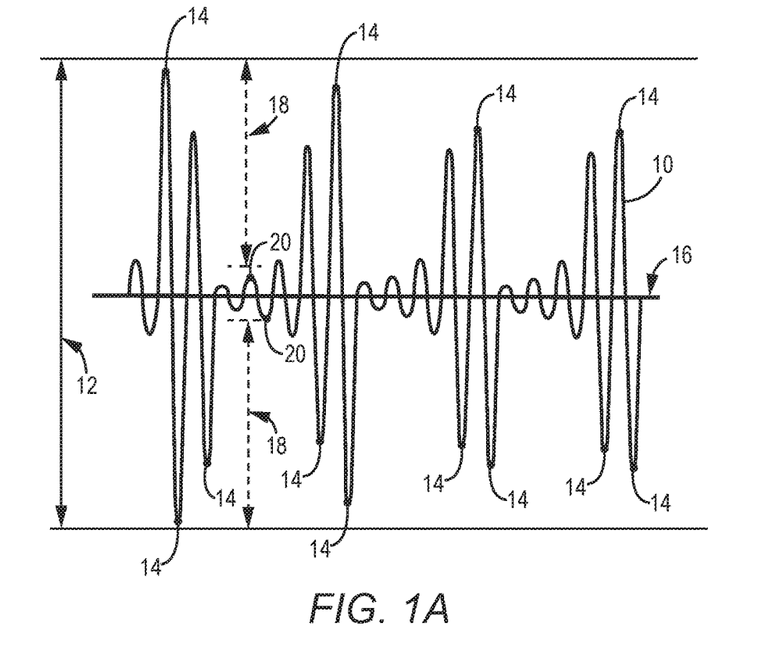
FIG. 1A is a schematic diagram of an exemplary amplitude-modulated radio frequency (RF) signal configured to be amplified based on a uniform supply voltage.
Figure 1B:
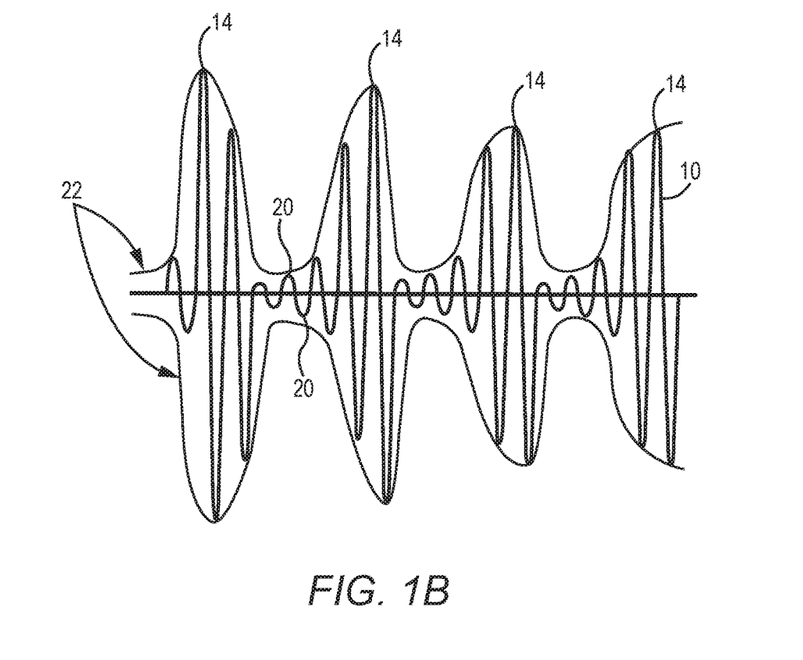
FIG. 1B is a schematic diagram of the amplitude-modulated RF signal of FIG. 1A configured to be amplified based on an envelope tracking (ET) supply voltage.

Before discussing the dual-mode ET power management circuit of the present disclosure, a brief overview of using envelope tracking to reduce power consumption when amplifying an amplitude-modulated RF signal is first provided with reference to FIGS. 1A and 1B. An overview of an ET amplifier is then discussed with reference to FIG. 2. The discussion of specific exemplary aspects of a dual-mode ET power management circuit starts below with reference to FIG. 3.

Figure 2:
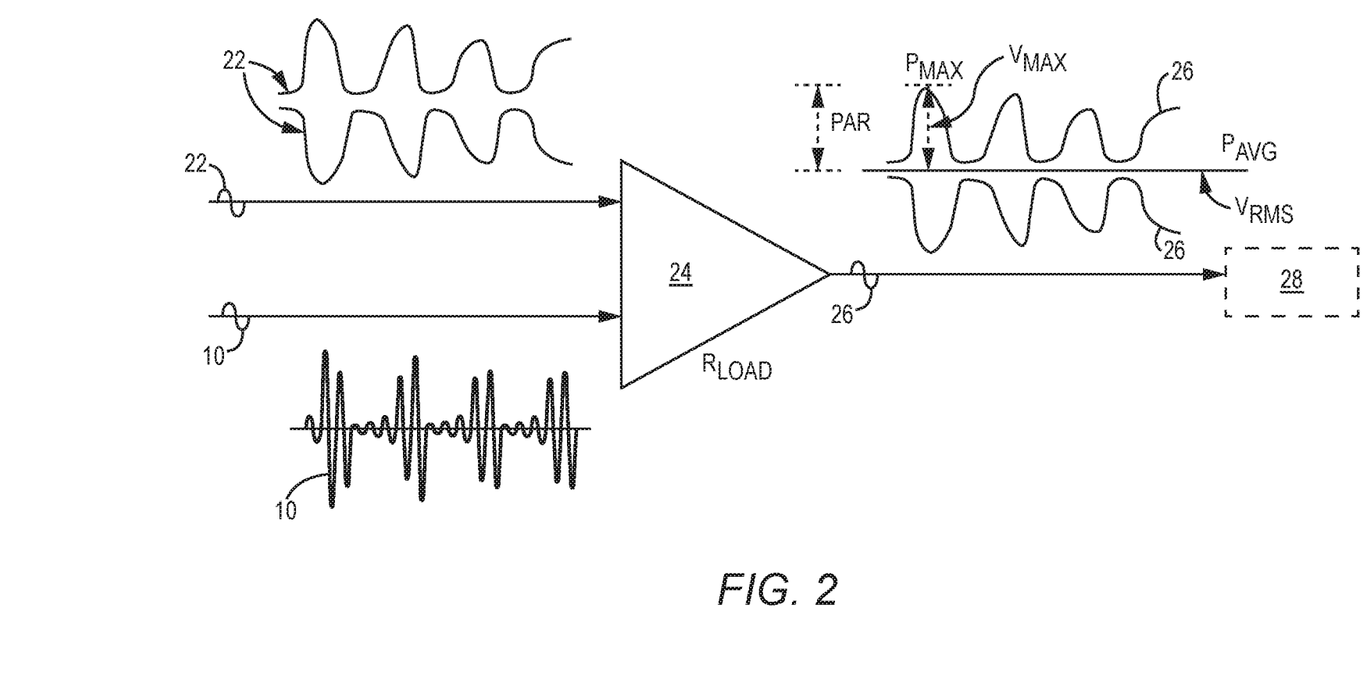
FIG. 2 is a schematic diagram of an exemplary ET amplifier configured to generate an ET-modulated RF signal by amplifying the amplitude-modulated RF signal of FIG. 1A based on the ET supply voltage of FIG. 1B.

In this regard, FIG. 1A is a schematic diagram of an exemplary amplitude-modulated RF signal 10 configured to be amplified based on a uniform supply voltage 12. In a non-limiting example, wireless communication systems (not shown), such as long-term evolution (LTE) communication system for example, use amplitude modulation techniques (e.g., quadrature amplitude modulation (QAM)) to modulate data onto the amplitude-modulated RF signal 10. The amplitude-modulated RF signal 10 is subsequently amplified to a desired power level by an amplifier, which is illustrated in FIG. 2, before being communicated in an RF spectrum. The RF amplifier is configured to amplify the amplitude-modulated RF signal 10 to the desired power level based on the uniform supply voltage 12.

However, amplitude modulation techniques can generate peak points 14 relative to an average point 16 in the amplitude-modulated RF signal 10. In this regard, the uniform supply voltage 12 is required to be high enough to deliver the desired power level at the peak points 14. As a result, a surplus supply voltage 18 may result at valley points 20 of the amplitude-modulated RF signal 10. The surplus supply voltage 18 not only causes unnecessary power consumption, but also generates additional heat in the wireless communication systems. ET is a power management technology that can help reduce the surplus supply voltage 18 when amplifying the amplitude-modulated RF signal 10.

In this regard, FIG. 1B is a schematic diagram of the amplitude-modulated RF signal 10 of FIG. 1A configured to be amplified based on an ET supply voltage 22. According to FIG. 1B, the ET supply voltage 22 increases at the peak points 14 of the amplitude-modulated RF signal 10 and decreases at the valley points 20 of the amplitude-modulated RF signal 10. As such, the surplus supply voltage 18 may be reduced.

FIG. 2 is a schematic diagram of an exemplary ET amplifier 24 configured to generate an ET-modulated RF signal 26 by amplifying the amplitude-modulated RF signal 10 of FIG. 1A based on the ET supply voltage 22 of FIG. 1B. Common elements between FIGS. 1A, 1B, and 2 are shown therein with common element numbers and will not be re-described herein.

The ET amplifier 24 has a load line $R_{LOAD}$, which is preconfigured to match an impedance of a coupled RT transmission circuit 28. Power and voltage levels of the ET-modulated RF signal 26 vary according to the ET supply voltage 22. The ET-modulated RF signal 26 has a maximum power $P_{MAX}$ that corresponds to a maximum voltage $V_{MAX}$. The relationship between the maximum power $P_{MAX}$ and the maximum voltage $V_{MAX}$ can be expressed in the equation (Eq. 1) below.

$$P_{MAX} = \frac{(V_{MAX} - V_{CEsat})^2}{2 * R_{LOAD}} \quad \text{(Eq. 1)}$$

In the equation (Eq. 1) above, $V_{CEsat}$ represents saturation voltage of transistors inside in the ET amplifier 24, which is typically 0.25 volts (0.25 V). The maximum power $P_{MAX}$ is measured in milliwatts (mW). The ET-modulated RF signal 26 has an average power $P_{AVG}$ that corresponds to a root-mean-square (RMS) voltage $V_{RMS}$. The relationship between the average power $P_{AVG}$ and the RMS voltage $V_{RMS}$ can be expressed in the equation (Eq. 2) below.

$$P_{AVG} = \frac{(V_{RMS} - V_{CEsat})^2}{2 * R_{LOAD}} \quad \text{(Eq. 2)}$$

In the equation (Eq. 2) above, the average power $P_{AVG}$ is also measured in mW. A power measured in mW ($P_{mW}$) can be converted into a power measured in decibel-milliwatts ($P_{dBm}$) based on the equation (Eq. 3) below.

$$P_{dBm} = 10 * \text{Log}_{10}(P_{mW}) \quad \text{(Eq. 3)}$$

The difference between the maximum power $P_{MAX}$ and the average power $P_{AVG}$ of the ET-modulated RF signal 26 is known as peak-to-average ratio (PAR), which can be expressed in the equation (Eq. 4) below.

$$PAR = P_{MAX} - P_{AVG} \quad \text{(Eq. 4)}$$

The ET-modulated RF signal 26 may be transmitted in different RF spectrums. The ET-modulated RF signal 26 may be transmitted based on frequency-division duplex (FDD) in LTE band 7, which occupies 2500 MHz to 2570 MHz uplink RF spectrum and 2620 MHz to 2690 MHz downlink RF spectrum. The ET-modulated RF signal 26 may also be transmitted based on time-division duplex (TDD) in LTE band 41, which occupies 2496 MHz to 2690 MHz RF spectrum.

The ET-modulated RF signal 26 may also be transmitted in different power classes in different RF spectrums. For example, the ET-modulated RF signal 26 can be transmitted in power class 2, which corresponds to 26 dBm average power in LTE band 41, and in power class 3, which corresponds to 23 dBm average power in LTE band 7. Moreover, the ET-modulated RF signal 26 may alternate between being transmitted in LTE band 41 and LTE band 7 depending on deployment and usage scenarios. In this regard, the ET-modulated RF signal 26 needs to be generated with 23 dBm average power and 26 dBm average power for transmission in the LTE band 7 and the LTE band 41, respectively.

Three conventional approaches for generating the ET-modulated RF signal 26 in both power class 2 and power class 3 exist. In a first conventional approach, the ET amplifier 24 can be configured to generate the ET-modulated RF signal 26 in power class 3 for transmission in LTE band 7. When the ET-modulated RF signal 26 needs to be transmitted in power class 2 in LTE band 41, the preconfigured load line $R_{LOAD}$ of the ET amplifier 24 is reduced. According to equation (Eq. 2) above, by reducing the preconfigured load line $R_{LOAD}$ appropriately, it is possible to cause the average power $P_{AVG}$ to increase from power class 3 (23 dBm) to power class 2 (26 dBm). However, reducing the preconfigured load line $R_{LOAD}$ of the ET amplifier 24 can degrade the efficiency of the ET amplifier 24 by approximately 3-4%. In addition, reducing the preconfigured load line $R_{LOAD}$ can lead to increased maximum current when the ET-modulated RF signal 26 is transmitted at the maximum power $P_{MAX}$ with the maximum voltage $V_{MAX}$. The increased maximum current can cause thermal power issues that may increase the risk of battery shutdown.

A second convention approach for generating the ET-modulated RF signal 26 in both power class 2 and power class 3 involves load line switching. However, load line switching can introduce approximately −3 dB insertion loss in the ET amplifier 24. As a result, the ET amplifier 24 may need to employ low equivalent series resistance (ESR) switches, which can lead to additional insertion loss.

A third conventional approach for generating the ET-modulated RF signal 26 in both power class 2 and power class 3 involves adding an additional ET amplifier dedicated to generating the ET-modulated RF signal 26 in power class 2 in the ET amplifier 24. However, employing an additional ET amplifier can lead to increased cost, footprint, and power consumption of the ET amplifier 24.

Figure 3:
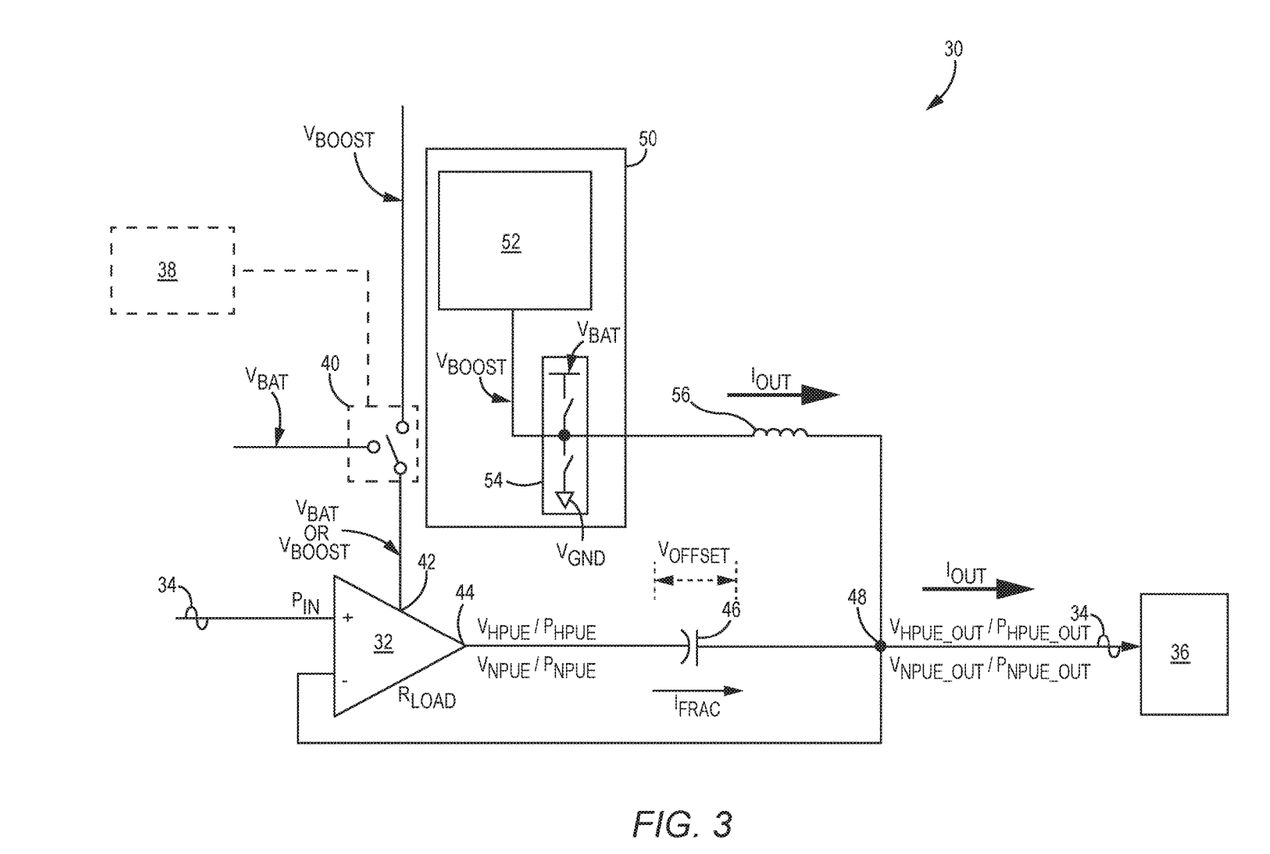
FIG. 3 is a schematic diagram of an exemplary dual-mode ET power management circuit including at least one ET amplifier configured to amplify at least one RF signal in a normal-power user equipment (NPUE) mode and a high-power user equipment (HPUE) mode while maintaining a constant load line between the NPUE mode and the HPUE mode.

In this regard, it may be desired to generate the ET-modulated RF signal 26 in both power class 2 with 26 dBm average power and in power class 3 with 23 dBm average power without compromising efficiency and/or increasing insertion loss, cost, footprint, and power consumption of the ET amplifier 24. In this regard, FIG. 3 is a schematic diagram of an exemplary dual-mode ET power management circuit 30 including at least one ET amplifier 32 configured to amplify at least one RF signal 34 in an NPUE mode and an HPUE mode while maintaining a constant load line between the NPUE mode and the HPUE mode. Hereinafter, the NPUE mode and the HPUE mode refer to the ET amplifier 32 amplifying the RF signal 34 to power class 3 average power (23 dBm) and power class 2 average power (26 dBM), respectively.

In this regard, in the NPUE mode, the ET amplifier 32 is configured to amplify the RF signal 34 to an NPUE voltage $V_{NPUE}$ based on a supply voltage $V_{BAT}$. Accordingly, the RF signal 34 has an average NPUE power $P_{NPUE}$. Alternatively, in the HPUE mode, the ET amplifier 32 is configured to amplify the RF signal 34 to an HPUE voltage $V_{HPUE}$ based on a boosted supply voltage $V_{BOOST}$. Accordingly, the RF signal 34 has an average HPUE power $P_{HPUE}$. Notably, the boosted supply voltage $V_{BOOST}$ is higher than the supply voltage $V_{BAT}$. In a non-limiting example, the boosted supply voltage $V_{BOOST}$ is less than or equal to two times the supply voltage $V_{BAT}$ ($V_{BAT} \leq V_{BOOST} \leq 2*V_{BAT}$). As a result, the HPUE voltage $V_{HPUE}$ is higher than the NPUE voltage $V_{NPUE}$.

The ET amplifier 32 has a preconfigured load line $R_{LOAD}$, which is preconfigured to provide impedance matching for an RF transmission circuit 36. The ET amplifier 32 is configured to maintain the preconfigured load line $R_{LOAD}$ constant while operating in the NPUE mode and the HPUE mode. As will be further discussed later, by maintaining the preconfigured load line $R_{LOAD}$ constant between the NPUE mode and the HPUE mode, it is possible to maintain power amplifier efficiency (PAE) and ET efficiency when the ET amplifier 32 toggles between the NPUE mode and the HPUE mode.

The dual-mode ET power management circuit 30 includes a power management circuit 38, which can be a microprocessor, a microcontroller, a digital signal processor (DSP), and/or a field-programmable gate array (FPGA), for example. In a non-limiting example, the power management circuit 38 can determine or detect whether the ET amplifier 32 is configured to operate in the NPUE mode or the HPUE mode. When the ET amplifier 32 operates in the NPUE mode, the power management circuit 38 provides the supply voltage $V_{BAT}$ to the ET amplifier 32. Alternatively, when the ET amplifier 32 operates in the HPUE mode, the power management circuit 38 provides the boosted supply voltage $V_{BOOST}$ to the ET amplifier 32. In a non-limiting example, the power management circuit 38 provides the supply voltage $V_{BAT}$ or the boosted supply voltage $V_{BOOST}$ to the ET amplifier 32 via switching circuitry 40.

The ET amplifier 32 includes a voltage input 42 configured to receive the supply voltage $V_{BAT}$ in the NPUE mode or the boosted supply voltage $V_{BOOST}$ in the HPUE mode. The ET amplifier 32 includes a voltage output 44 configured to output the RF signal 34 at the NPUE voltage $V_{NPUE}$ in the NPUE mode or output the RF signal 34 at the HPUE voltage $V_{HPUE}$ in the HPUE mode.

The dual-mode ET power management circuit 30 includes at least one offset capacitor 46 provided between the voltage output 44 of the ET amplifier 32 and a signal output 48, which is coupled to the RF transmission circuit 36. In a non-limiting example, the offset capacitor 46 has a capacitance of 2.2 microFarad (μF). The dual-mode ET power management circuit 30 also includes at least one charge pump 50, which is configured to provide an electrical current $I_{OUT}$ to the signal output 48. The charge pump 50 includes voltage boost circuitry 52 and switcher circuitry 54. The voltage boost circuitry 52 is capable of generating the boosted supply voltage $V_{BOOST}$. The switcher circuitry 54 can be controlled (e.g., by the power management circuit 38) to provide the supply voltage $V_{BAT}$, the boosted supply voltage $V_{BOOST}$, or a ground voltage $V_{GND}$ to an inductor 56. In a non-limiting example, the inductor 56 has an inductance of 2.2 microHenry (μH), which can induce the electrical current $I_{OUT}$ based on the voltage ($V_{BAT}$, $V_{BOOST}$, or $V_{GND}$) provided by the switcher circuitry 54.

When the ET amplifier 32 operates in the NPUE mode, the offset capacitor 46 is configured to increase the NPUE voltage $V_{NPUE}$ by an offset voltage $V_{OFFSET}$ to provide an NPUE output voltage $V_{NPUE\_OUT}$ at the signal output 48. The NPUE output voltage $V_{NPUE\_OUT}$ and the electrical current $I_{OUT}$ cause the RF signal 34 to be transmitted at an NPUE output power $P_{NPUE\_OUT}$ (e.g., 23 dBm or power class 3) ($P_{NPUE\_OUT}=V_{NPUE\_OUT}*I_{OUT}$) from the RF transmission circuit 36 in an NPUE RF spectrum (e.g., LTE band 7). Notably, the electrical current $I_{OUT}$ may include a fractional current $I_{FRAC}$ induced by the offset capacitor 46.

When the ET amplifier 32 operates in the HPUE mode, the offset capacitor 46 is configured to increase the HPUE voltage $V_{HPUE}$ by the offset voltage $V_{OFFSET}$ to provide an HPUE output voltage $V_{HPUE\_OUT}$ at the signal output 48. The HPUE output voltage $V_{HPUE\_OUT}$ and the electrical current $I_{OUT}$ cause the RF signal 34 to be transmitted at an HPUE output power $P_{HPUE\_OUT}$ (e.g., 26 dBm or power class 2) ($P_{HPUE\_OUT}=V_{HPUE\_OUT}*I_{OUT}$) from the RF transmission circuit 36 in an HPUE RF spectrum (e.g., LTE band 41). Notably, the electrical current $I_{OUT}$ may include the fractional current $I_{FRAC}$ induced by the offset capacitor 46.

Figure 4:
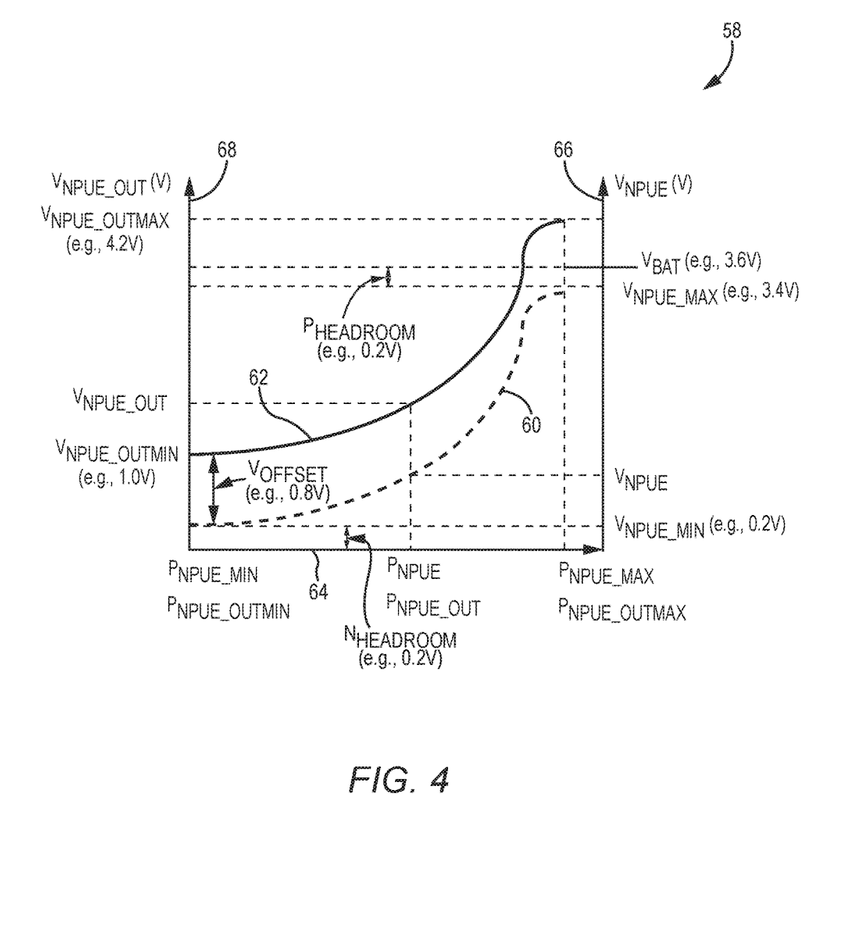
FIG. 4 is a plot providing an exemplary illustration of a first NPUE look-up-table (LUT) and a second NPUE LUT that can be employed by the at least one ET amplifier of FIG. 3 to output the at least one RF signal at an NPUE voltage and an NPUE output voltage, respectively.

In the NPUE mode, the ET amplifier 32 is configured to amplify the RF signal 34 to the NPUE voltage $V_{NPUE}$ based on an NPUE look-up-table (LUT). In this regard, FIG. 4 is a plot 58 providing an exemplary illustration of a first NPUE LUT 60 and a second NPUE LUT 62 that can be employed by the dual-mode ET power management circuit 30 of FIG. 3 to output the RF signal 34 at the NPUE voltage $V_{NPUE}$ and the NPUE output voltage $V_{NPUE\_OUT}$, respectively. Common elements between FIGS. 3 and 4 are shown therein with common element numbers and will not be re-described herein.

In the plot 58, a horizontal axis 64 represents NPUE power $P_{NPUE}$ of the RF signal 34 at the voltage output 44 and NPUE output power $P_{NPUE\_OUT}$ of the RF signal 34 at the signal output 48 of FIG. 3. A first vertical axis 66 represents NPUE voltage $V_{NPUE}$ of the RF signal 34 at the voltage output 44. A second vertical axis 68 represents NPUE output voltage $V_{NPUE\_OUT}$ of the RF signal 34 at the signal output 48.

The ET amplifier 32 is configured to amplify the RF signal 34 to the NPUE voltage $V_{NPUE}$ at the voltage output 44 based on the first NPUE LUT 60. According to the first NPUE LUT 60, the ET amplifier 32 amplifies the RF signal 34 to an NPUE minimum voltage $V_{NPUE\_MIN}$ to generate the RF signal 34 at an NPUE minimum power $P_{NPUE\_MIN}$. The ET amplifier 32 outputs the RF signal 34 to an NPUE maximum voltage $V_{NPUE\_MAX}$ to generate the RF signal 34 at an NPUE maximum power $P_{NPUE\_MAX}$. Accordingly, the ET amplifier 32 amplifies the RF signal 34 to the NPUE voltage $V_{NPUE}$, which is an RMS average of the minimum NPUE voltage $V_{NPUE\_MIN}$ and the maximum NPUE voltage $V_{NPUE\_MAX}$, to generate the RF signal 34 at the average NPUE power $P_{NPUE}$.

In a non-limiting example, the NPUE minimum voltage $V_{NPUE\_MIN}$ equals a bottom headroom voltage $N_{Headroom}$, which is 0.2 V for example. The NPUE maximum voltage $V_{NPUE\_MAX}$ equals 3.4 V, for example. As such, the average NPUE voltage $V_{NPUE}$ is greater than or equal to the NPUE minimum voltage $V_{NPUE\_MIN}$ and less than or equal to the NPUE maximum voltage $V_{NPUE\_MAX}$ ($V_{NPUE\_MIN} \leq V_{NPUE} \leq V_{NPUE\_MAX}$). The supply voltage $V_{BAT}$ required by the ET amplifier 32 to amplify the RF signal 34 to the NPUE maximum voltage $V_{NPUE\_MAX}$ equals the NPUE maximum voltage $V_{NPUE\_MAX}$ plus a top headroom voltage $P_{Headroom}$. If the top headroom voltage $P_{Headroom}$ is also 0.2 V, for example, the supply voltage $V_{BAT}$ required by the ET amplifier 32 to amplify the RF signal 34 to the NPUE maximum voltage $V_{NPUE\_MAX}$ would be 3.6 V (3.4 V+0.2 V).

The second NPUE LUT 62 is employed by the ET amplifier 32 to output the RF signal 34 at the NPUE output voltage $V_{NPUE\_OUT}$ via the signal output 48. In essence, the second NPUE LUT 62 is produced by shifting the first NPUE LUT 60 upward for the offset voltage $V_{OFFSET}$, which is provided by the offset capacitor 46 of FIG. 3.

According to the second NPUE LUT 62, the ET amplifier 32 outputs the RF signal 34 at an NPUE minimum output voltage $V_{NPUE\_OUTMIN}$ to cause the RF signal 34 to be transmitted at an NPUE minimum output power $P_{NPUE\_OUTMIN}$. The ET amplifier 32 outputs the RF signal 34 at an NPUE maximum output voltage $V_{NPUE\_OUTMAX}$ to cause the RF signal 34 to be transmitted at an NPUE maximum output power $P_{NPUE\_OUTMAX}$. The ET amplifier 32 outputs the RF signal 34 at the NPUE output voltage $V_{NPUE\_OUT}$, which is an RMS average of the NPUE minimum output voltage $V_{NPUE\_OUTMIN}$ and the NPUE maximum output voltage $V_{NPUE\_OUTMAX}$, to cause the RF signal 34 to be transmitted at the NPUE output power $P_{NPUE\_OUT}$.

In a non-limiting example, the offset voltage $V_{OFFSET}$ equals 0.8 V. Accordingly, the NPUE minimum output voltage $V_{NPUE\_OUTMIN}$ equals the bottom headroom voltage $N_{Headroom}$ plus the offset voltage $V_{OFFSET}$ ($V_{NPUE\_OUTMIN}=V_{OFFSET}+N_{Headroom}$), which is 1 V (0.8 V+0.2 V). The NPUE maximum output voltage $V_{NPUE\_OUTMAX}$ is also shifted upward by the offset voltage $V_{OFFSET}$, and thus equals 4.2 V (3.4 V+0.8 V). As such, the NPUE output voltage $V_{NPUE\_OUT}$ is greater than or equal to the NPUE minimum output voltage $V_{NPUE\_OUTMIN}$ and less than or equal to the NPUE maximum output voltage $V_{NPUE\_OUTMAX}$ ($V_{NPUE\_OUTMIN} \leq V_{NPUE\_OUT} \leq V_{NPUE\_OUTMAX}$). The supply voltage $V_{BAT}$ required by the ET amplifier 32 to output the RF signal 34 at the NPUE maximum output voltage $V_{NPUE\_OUTMAX}$ equals the NPUE maximum output voltage $V_{NPUE\_OUTMAX}$ minus the offset voltage $V_{OFFSET}$, and plus the top headroom voltage $P_{Headroom}$ ($V_{BAT}=V_{NPUE\_OUTMAX}-V_{OFFSET}+P_{Headroom}$), which equals 3.6 V (4.2 V−0.8 V+0.2 V).

Figure 5:
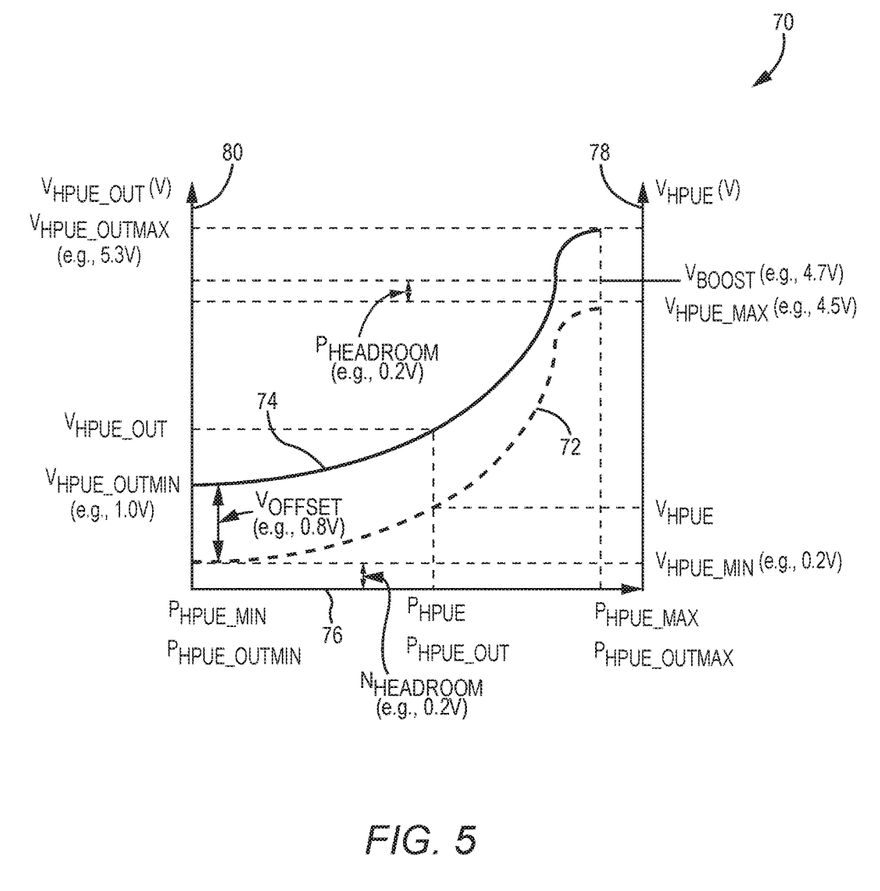
FIG. 5 is a plot providing an exemplary illustration of a first HPUE LUT and a second HPUE LUT that can be employed by the at least one ET amplifier of FIG. 3 to output the at least one RF signal at an HPUE voltage and an HPUE output voltage, respectively.

With reference back to FIG. 3, in the HPUE mode, the ET amplifier 32 is configured to amplify the RF signal 34 to the HPUE voltage $V_{HPUE}$ based on an HPUE LUT. In this regard, FIG. 5 is a plot 70 providing an exemplary illustration of a first HPUE LUT 72 and a second HPUE LUT 74 that can be employed by the ET amplifier 32 of FIG. 3 to output the RF signal 34 at the HPUE voltage $V_{HPUE}$ and the HPUE output voltage $V_{HPUE\_OUT}$, respectively. Common elements between FIGS. 3 and 5 are shown therein with common element numbers and will not be re-described herein.

In the plot 70, a horizontal axis 76 represents HPUE power $P_{HPUE}$ of the RF signal 34 at the voltage output 44 and HPUE output power $P_{HPUE\_OUT}$ of the RF signal 34 at the signal output 48 of FIG. 3. A first vertical axis 78 represents HPUE voltage $V_{HPUE}$ of the RF signal 34 at the voltage output 44. A second vertical axis 80 represents HPUE output voltage $V_{HPUE\_OUT}$ of the RF signal 34 at the signal output 48.

The ET amplifier 32 is configured to amplify the RF signal 34 to the HPUE voltage $V_{HPUE}$ at the voltage output 44 based on the first HPUE LUT 72. According to the first HPUE LUT 72, the ET amplifier 32 amplifies the RF signal 34 to an HPUE minimum voltage $V_{HPUE\_MIN}$ to generate the RF signal 34 at an HPUE minimum power $P_{HPUE\_MIN}$. The ET amplifier 32 outputs the RF signal 34 to an HPUE maximum voltage $V_{HPUE\_MAX}$ to generate the RF signal 34 at an HPUE maximum power $P_{HPUE\_MAX}$. Accordingly, the ET amplifier 32 amplifies the RF signal 34 to the HPUE voltage $V_{HPUE}$, which is an RMS average of the HPUE minimum voltage $V_{HPUE\_MIN}$ and the HPUE maximum voltage $V_{HPUE\_MAX}$, to generate the RF signal 34 at an average HPUE power $P_{HPUE}$.

In a non-limiting example, the HPUE minimum voltage $V_{HPUE\_MIN}$ equals the bottom headroom voltage $N_{Headroom}$. The HPUE maximum voltage $V_{HPUE\_MAX}$ equals 4.5 V, for example. As such, the HPUE voltage $V_{HPUE}$ is greater than or equal to the HPUE minimum voltage $V_{HPUE\_MIN}$ and less than or equal to the HPUE maximum voltage $V_{HPUE\_MAX}$ ($V_{HPUE\_MIN} \leq V_{HPUE} \leq V_{HPUE\_MAX}$). The boosted supply voltage $V_{BOOST}$ required by the ET amplifier 32 to amplify the RF signal 34 to the HPUE maximum voltage $V_{HPUE\_MAX}$ equals the HPUE maximum voltage $V_{HPUE\_MAX}$ plus the top headroom voltage $P_{Headroom}$. In this regard, the boosted supply voltage $V_{BOOST}$ required by the ET amplifier 32 to amplify the RF signal 34 to the HPUE maximum voltage $V_{HPUE\_MAX}$ would be 4.7 V (4.5 V+0.2 V).

The second HPUE LUT 74 is employed by the ET amplifier 32 to output the RF signal 34 at the HPUE output voltage $V_{HPUE\_OUT}$ via the signal output 48. In essence, the second HPUE LUT 74 is produced by shifting the first HPUE LUT 72 upward for the offset voltage $V_{OFFSET}$, which is provided by the offset capacitor 46 of FIG. 3.

According to the second HPUE LUT 74, the ET amplifier 32 outputs the RF signal 34 at an HPUE minimum output voltage $V_{HPUE\_OUTMIN}$ to cause the RF signal 34 to be transmitted at an HPUE minimum output power $P_{HPUE\_OUTMIN}$. The ET amplifier 32 outputs the RF signal 34 at an HPUE maximum output voltage $V_{HPUE\_OUTMAX}$ to cause the RF signal 34 to be transmitted at an HPUE maximum output power $P_{HPUE\_OUTMAX}$. The ET amplifier 32 outputs the RF signal 34 at the HPUE output voltage $V_{HPUE\_OUT}$, which is an RMS average of the HPUE minimum output voltage $V_{HPUE\_OUTMIN}$ and the HPUE maximum output voltage $V_{HPUE\_OUTMAX}$, to cause the RF signal 34 to be transmitted at the HPUE output power $P_{HPUE\_OUT}$, which is an average HPUE output power.

In a non-limiting example, the offset voltage $V_{OFFSET}$ equals 0.8 V. Accordingly, the HPUE minimum output voltage $V_{HPUE\_OUTMIN}$ can be determined based on the equation (Eq. 5) below.

$$V_{HPUE\_OUTMIN} = V_{OFFSET} + N_{Headroom} \quad \text{(Eq. 5)}$$

According to equation (Eq. 5), the HPUE minimum output voltage $V_{HPUE\_OUTMIN}$ equals 1 V (0.8 V+0.2 V). The HPUE maximum output voltage $V_{HPUE\_OUTMAX}$ is also shifted upward by the offset voltage $V_{OFFSET}$, and thus equals 5.3 V (4.5 V+0.8 V). As such, the HPUE output voltage $V_{HPUE\_OUT}$ is greater than or equal to the HPUE minimum output voltage $V_{HPUE\_OUTMIN}$ and less than or equal to the HPUE maximum output voltage $V_{HPUE\_OUTMAX}$ ($V_{HPUE\_OUTMIN} \leq V_{HPUE\_OUT} \leq V_{HPUE\_OUTMAX}$). The boosted supply voltage $V_{BOOST}$ required by the ET amplifier 32 to output the RF signal 34 at the HPUE maximum output voltage $V_{HPUE\_OUTMAX}$ equals the HPUE maximum output voltage $V_{HPUE\_OUTMAX}$ minus the offset voltage $V_{OFFSET}$, and plus the top headroom voltage $P_{Headroom}$ ($V_{BOOST} = V_{HPUE\_OUTMAX} - V_{OFFSET} + P_{Headroom}$), which equals 4.7 V (5.3 V-0.8 V+0.2 V).

Figure 6:
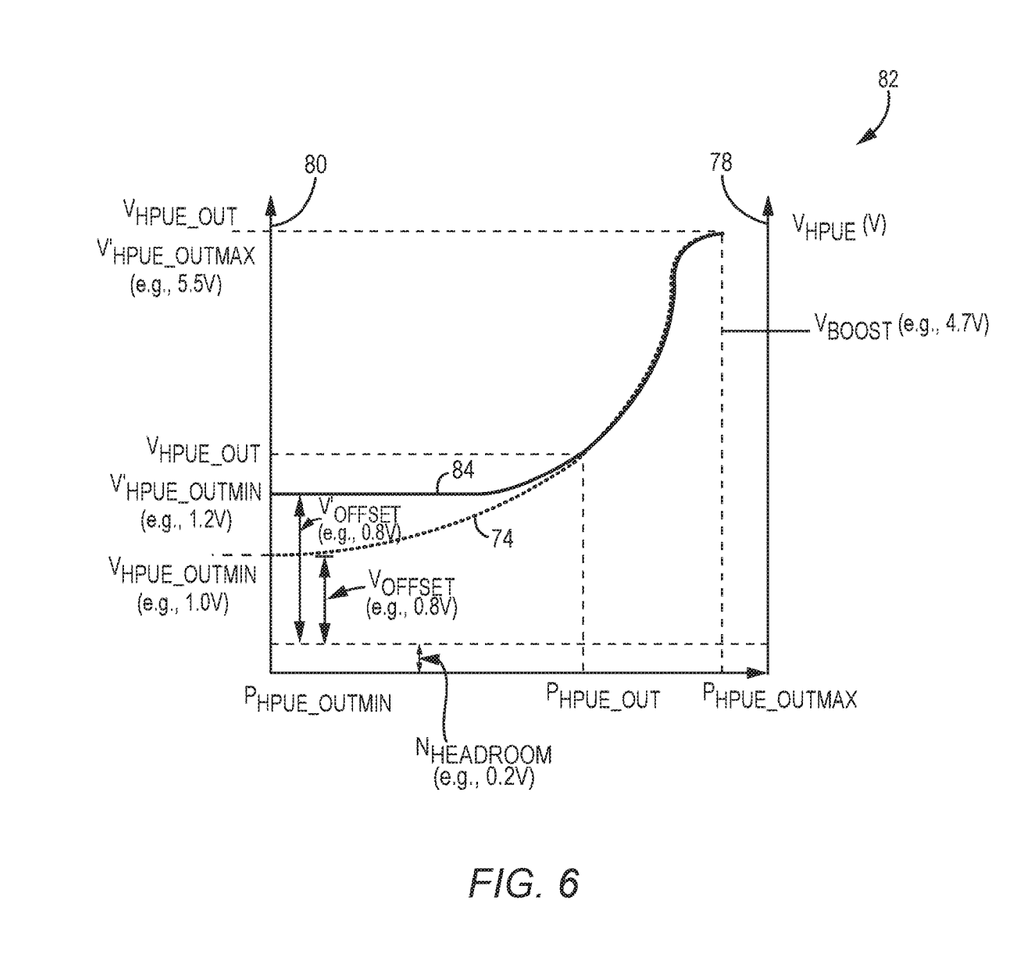
FIG. 6 is a plot providing an exemplary illustration of a clipped HPUE LUT that can be employed by the at least one ET amplifier of FIG. 3 to increase maximum HPUE output voltage of the at least one ET amplifier.

In an exemplary aspect, it is possible to further increase the HPUE maximum output voltage $V_{HPUE\_OUTMAX}$ without increasing the boosted supply voltage $V_{BOOST}$. In this regard, FIG. 6 is a plot 82 providing an exemplary illustration of a clipped HPUE LUT 84 that can be employed by the ET amplifier 32 of FIG. 3 to increase the HPUE maximum output voltage $V_{HPUE\_OUTMAX}$ of the ET amplifier 32. Common elements between FIGS. 5 and 6 are shown therein with common element numbers and will not be re-described herein.

The clipped HPUE LUT 84 is generated by bottom clipping (bottom flattening) the second HPUE LUT 74. The clipped HPUE LUT 84 raises the offset voltage $V_{OFFSET}$ from 0.8 V in FIG. 5 to 1.0 V in FIG. 6 (shown as $V'_{OFFSET}$). According to equation (Eq. 5) above, the HPUE minimum output voltage $V_{HPUE\_OUTMIN}$ is increased from 1.0 V in FIG. 5 to 1.2 V in FIG. 6 (shown as $V'_{HPUE\_OUTMIN}$). As a result, the HPUE maximum output voltage $V_{HPUE\_OUTMAX}$ is increased from 5.3 V in FIG. 5 to 5.5 V in FIG. 6 (shown as $V'_{HPUE\_OUTMAX}$). Hence, by bottom clipping the second HPUE LUT 74, it is possible to increase the HPUE maximum output voltage $V_{HPUE\_OUTMAX}$ without increasing the boosted supply voltage $V_{BOOST}$.

With reference back to FIG. 3, in addition to employing the clipped HPUE LUT 84 to increase the HPUE maximum output voltage $V_{HPUE\_OUTMAX}$, it may be possible to further increase the HPUE minimum output voltage $V_{HPUE\_OUTMIN}$, the HPUE output voltage $V_{HPUE\_OUT}$, and the HPUE maximum output voltage $V_{HPUE\_OUTMAX}$ by further reducing insertion loss between the ET amplifier 32 and the RF transmission circuit 36. For example, it may be possible to include a dedicated signal path for carrying the RF signal 34 when the RF signal 34 is to be transmitted from the RF transmission circuit 36 in the HPUE RF spectrum.

Figure 7:
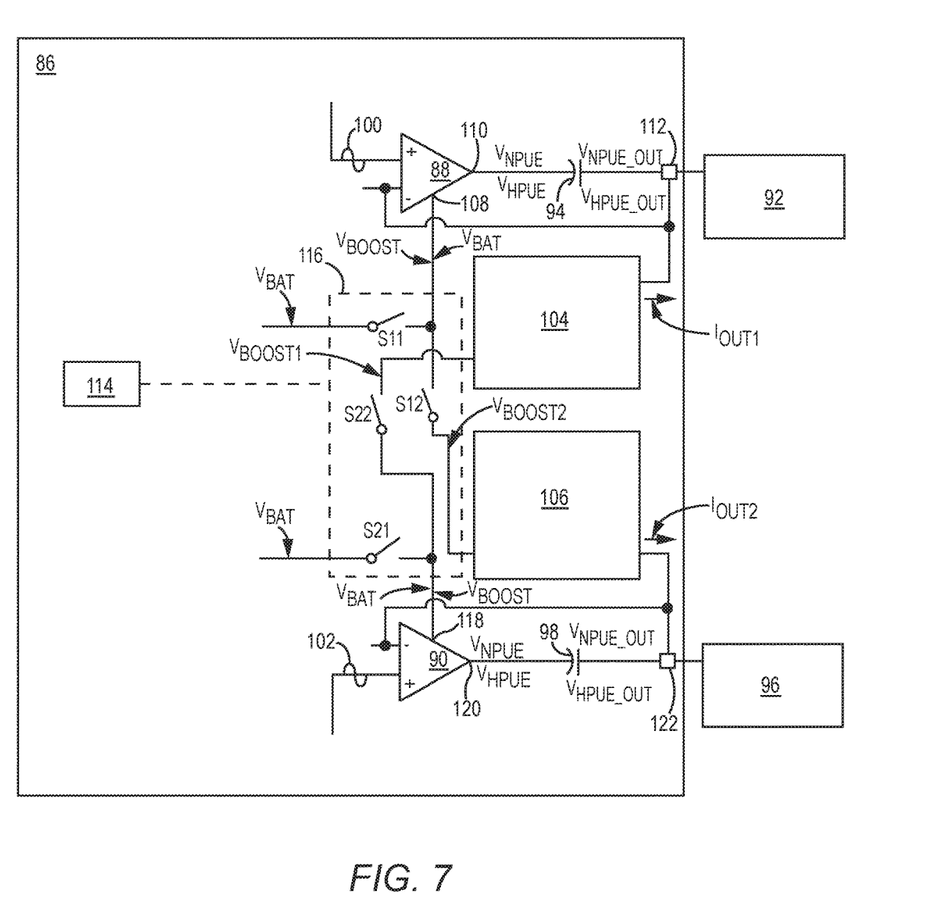
FIG. 7 is a schematic diagram of an exemplary ET power management circuit in which one of a first ET amplifier and a second ET amplifier can be configured to function as the at least one ET amplifier of FIG. 3.

The ET amplifier 32 of FIG. 3 can be provided in an ET power management circuit that can be switched dynamically from a double-transmit (DTX) operation mode to a single-transmit (STX) operation mode. In this regard, FIG. 7 is a schematic diagram of an exemplary ET power management circuit 86 in which one of a first ET amplifier 88 and a second ET amplifier 90 can be configured to function as the ET amplifier 32 of FIG. 3. Elements of FIG. 3 are referenced in conjunction with FIG. 7, and will not be re-described herein.

The first ET amplifier 88 is coupled to a first RF transmission circuit 92 via a first offset capacitor 94. The second ET amplifier 90 is coupled to a second RF transmission circuit 96 via a second offset capacitor 98. The first offset capacitor 94 and the second offset capacitor 98 are functionally equivalent to the offset capacitor 46 of FIG. 3. The first ET amplifier 88 is configured to amplify at least one first RF signal 100 for transmission via the first RF transmission circuit 92. The second ET amplifier 90 is configured to amplify at least one second RF signal 102 for transmission via the second RF transmission circuit 96. The first RF signal 100 and the second RF signal 102 may be transmitted simultaneously, thus enabling such DTX operations as multiple-input, multiple-output (MIMO) and/or carrier aggregation (CA).

The ET power management circuit 86 includes a first charge pump 104 coupled to the first ET amplifier 88 and a second charge pump 106 coupled to the second ET amplifier 90. The first charge pump 104 and the second charge pump 106 are functionally equivalent to the charge pump 50 of FIG. 3. In this regard, the first charge pump 104 can generate a first boosted supply voltage $V_{BOOST1}$ and the second charge pump 106 can generate a second boosted supply voltage $V_{BOOST2}$. Similar to the boosted supply voltage $V_{BOOST}$ of FIG. 3, the first boosted supply voltage $V_{BOOST1}$ and the second boosted supply voltage $V_{BOOST2}$ are both less than or equal to two times the supply voltage $V_{BAT}$. In addition, the first charge pump 104 and the second charge pump 106 generate a first electrical current $I_{OUT1}$ and a second electrical current $I_{OUT2}$, respectively. The first electrical current $I_{OUT1}$ and the second electrical current $I_{OUT2}$ are functionally equivalent to the electrical current $I_{OUT}$ in FIG. 3.

In one non-limiting example, the ET power management circuit 86 is configured to operate in an STX operation mode by turning off the second ET amplifier 90. As such, the first ET amplifier 88 is configured to function as the ET amplifier 32 of FIG. 3 for amplifying the first RF signal 100 in the NPUE mode or the HPUE mode. The first ET amplifier 88 includes a first voltage input 108 and a first voltage output 110.

In the NPUE mode, the first ET amplifier 88 is configured to receive the supply voltage $V_{BAT}$ via the first voltage input 108. The first ET amplifier 88 amplifies the first RF signal 100 to the NPUE voltage $V_{NPUE}$ based on the supply voltage $V_{BAT}$ and outputs the first RF signal 100 at the NPUE voltage $V_{NPUE}$ via the first voltage output 110. Like the offset capacitor 46 in FIG. 3, the first offset capacitor 94 increases the NPUE voltage $V_{NPUE}$ to the NPUE output voltage $V_{NPUE\_OUT}$ at a first signal output 112. The ET power management circuit 86 includes a power management circuit 114, which is functionally equivalent to the power management circuit 38 of FIG. 3, and switching circuitry 116. The power management circuit 114 closes switch S11, while keeping other switches S12, S21, and S22 open, to provide the supply voltage $V_{BAT}$ to the first voltage input 108 of the first ET amplifier 88.

In the HPUE mode, the first ET amplifier 88 is configured to receive the boosted supply voltage $V_{BOOST}$ via the first voltage input 108. The first ET amplifier 88 amplifies the first RF signal 100 to the HPUE voltage $V_{HPUE}$ based on the boosted supply voltage $V_{BOOST}$ and outputs the first RF signal 100 at the HPUE voltage $V_{HPUE}$ via the first voltage output 110. Like the offset capacitor 46 in FIG. 3, the first offset capacitor 94 increases the HPUE voltage $V_{HPUE}$ to the HPUE output voltage $V_{HPUE\_OUT}$ at the first signal output 112. Since the second ET amplifier 90 is turned off, the second charge pump 106 can be used to provide the boosted supply voltage $V_{BOOST}$ to the first ET amplifier 88. In this regard, the power management circuit 114 closes switch S12, while keeping other switches S11, S21, and S22 open, to couple the second charge pump 106 to the first voltage input 108 of the first ET amplifier 88 to provide the second boosted supply voltage $V_{BOOST2}$ to the first voltage input 108 of the first ET amplifier 88 as the boosted supply voltage $V_{BOOST}$.

In another non-limiting example, the ET power management circuit 86 is configured to operate in an STX operation mode by turning off the first ET amplifier 88. As such, the second ET amplifier 90 is configured to function as the ET amplifier 32 of FIG. 3 for amplifying the second RF signal 102 in the NPUE mode or the HPUE mode. The second ET amplifier 90 includes a second voltage input 118 and a second voltage output 120.

In the NPUE mode, the second ET amplifier 90 is configured to receive the supply voltage $V_{BAT}$ via the second voltage input 118. The second ET amplifier 90 amplifies the second RF signal 102 to the NPUE voltage $V_{NPUE}$ based on the supply voltage $V_{BAT}$ and outputs the second RF signal 102 at the NPUE voltage $V_{NPUE}$ via the second voltage output 120. Like the offset capacitor 46 in FIG. 3, the second offset capacitor 98 increases the NPUE voltage $V_{NPUE}$ to the NPUE output voltage $V_{NPUE\_OUT}$ at a second signal output 122. The power management circuit 114 closes switch S21, while keeping other switches S11, S12, and S22 open, to provide the supply voltage $V_{BAT}$ to the second voltage input 118 of the second ET amplifier 90.

In the HPUE mode, the second ET amplifier 90 is configured to receive the boosted supply voltage $V_{BOOST}$ via the second voltage input 118. The second ET amplifier 90 amplifies the second RF signal 102 to the HPUE voltage $V_{HPUE}$ based on the boosted supply voltage $V_{BOOST}$ and outputs the second RF signal 102 at the HPUE voltage $V_{HPUE}$ via the second voltage output 120. Like the offset capacitor 46 in FIG. 3, the second offset capacitor 98 increases the HPUE voltage $V_{HPUE}$ to the HPUE output voltage $V_{HPUE\_OUT}$ at the second signal output 122. Since the first ET amplifier 88 is turned off, the first charge pump 104 can be used to provide the boosted supply voltage $V_{BOOST}$ to the second ET amplifier 90. In this regard, the power management circuit 114 closes switch S22, while keeping other switches S11, S12, and S21 open, to couple the first charge pump 104 to the second voltage input 118 of the second ET amplifier 90 to provide the first boosted supply voltage $V_{BOOST1}$ to the second voltage input 118 of the second ET amplifier 90 as the boosted supply voltage $V_{BOOST}$.

With reference back to FIG. 3, when the ET amplifier 32 is configured to operate in both the NPUE mode and the HPUE mode, the PAE of the ET amplifier 32 is dictated by the HPUE mode, in which the ET amplifier 32 receives a higher supply voltage (the boosted supply voltage $V_{BOOST}$) to cause the RF signal 34 to be transmitted at a higher peak output power (the maximum HPUE output power $P_{HPUE\_OUTMAX}$). When the ET amplifier 32 switches from the HPUE mode to the NPUE mode, in which the ET amplifier 32 receives a lower supply voltage (the supply voltage $V_{BAT}$) and produces a lower peak output power (the maximum NPUE output power $P_{NPUE\_OUTMAX}$), three factors may potentially cause the PAE of the ET amplifier 32 to drop. As such, it is necessary to prove that the ET amplifier 32 does not compromise the PAE beyond an acceptable limit with regard to each of the three factors.

First, output match loss of the ET amplifier 32 may become higher when the ET amplifier 32 switches from the boosted supply voltage $V_{BOOST}$ to the supply voltage $V_{BAT}$, thus causing the PAE of the ET amplifier 32 to drop. In a non-limiting example, the ET amplifier 32 is configured to generate the HPUE maximum voltage $V_{HPUE\_MAX}$ of 5.5 V based on the boosted supply voltage $V_{BOOST}$ to cause the RF signal 34 to be transmitted at the HPUE maximum output power $P_{HPUE\_OUTMAX}$ of 36.2 dBm ($\approx$4.2 Watts). If the saturation voltage $V_{CEsat}$ equals 0.25 V, the preconfigured load line RLOAD of the ET amplifier 32 would equal 3.2$\Omega$ based on the equation (Eq. 6) below.

$$R_{LOAD} = \frac{(V_{HPUE\_MAX} - V_{CEsat})^2}{2 * P_{HPUE\_OUTMAX}} \quad \text{(Eq. 6)}$$

When the ET amplifier 32 is switched to the NPUE mode, the ET amplifier 32 will be configured to generate the NPUE maximum output voltage $V_{NPUE\_OUTMAX}$ of 4.2 V based on the supply voltage $V_{BAT}$. However, the PAE of the ET amplifier 32 is still dictated by the maximum HPUE output power $P_{HPUE\_OUTMAX}$ of 36.2 dBm. As such, based on the equation (Eq. 6) above, the preconfigured load line $R_{LOAD}$ of the ET amplifier 32 would need to be reduced to 1.8$\Omega$. The reduction of the preconfigured load line $R_{LOAD}$ from 3.2$\Omega$ to 1.8$\Omega$ may cause insertion loss to increase, thus causing the PAE of the ET amplifier 32 to drop. A simulation indicates that the ET amplifier 32 suffers less than 1% reduction in the PAE when switching from the HPUE mode to the NPUE mode. In this regard, the ET amplifier 32 does not compromise the PAE beyond a common sense measure with regard to the output match loss.

Second, the saturation voltage $V_{CEsat}$ becomes more significant with respect to the NPUE voltage $V_{NPUE}$ than to the HPUE voltage $V_{HPUE}$. An HPUE PAE loss ratio $\eta_{HPUE}$ and an NPUE PAE loss ratio $\eta_{NPUE}$ with respect to the saturation voltage $V_{CEsat}$ can be determined based on the equation (Eq. 7.1) and the equation (Eq. 7.2) below, respectively.

$$\eta_{HPUE} = 1 - \frac{V_{CEsat}}{V_{HPUE}} \quad (Eq.\ 7.1)$$

$$\eta_{NPUE} = 1 - \frac{V_{CEsat}}{V_{NPUE}} \quad (Eq.\ 7.2)$$

Since the NPUE voltage $V_{NPUE}$ is lower than the HPUE voltage $V_{HPUE}$, the NPUE PAE loss ratio $\eta_{NPUE}$ will be higher than the HPUE PAE loss ratio $\eta_{HPUE}$. In a non-limiting example, the PAE of the ET amplifier 32 in the HPUE mode is 50%. A simulation indicates that the PAE of the ET amplifier 32 in the HPUE mode is approximately 48.8%. As such, the ET amplifier 32 does not compromise the PAE beyond a common sense measure with regard to the saturation voltage $V_{CEsat}$.

Third, combining loss inside the ET amplifier 32 may increase, thus causing the PAE of the ET amplifier 32 to drop. In one respect, a reduction in the preconfigured load line $R_{LOAD}$ may dictate larger output device (e.g., more cells) in the ET amplifier 32. For example, reducing the preconfigured load line RLOAD from 3.2Ω to 1.8Ω requires a 77% size increase to maintain the same current density in the ET amplifier 32. The combining loss inside the ET amplifier 32 may be influenced by size of the unit cell, heterojunction bipolar transistor (HBT) process metal stack, and lithography design. In this regard, simulation indicates that the ET amplifier 32 only suffer a 0.1 dB drop in combining loss. As such, the ET amplifier 32 does not compromise the PAE beyond a common sense measure with regard to the combining loss.

Simulation further indicates that the dual-mode ET power management circuit 30 maintains ET efficiency when switching from the HPUE mode to the NPUE mode. In a non-limiting example, the simulation is based on the dual-mode ET power management circuit 30 generating the HPUE maximum output power $P_{HPUE\_OUTMAX}$ at 31 dBm. A summary of the simulation results is present in Table 1 below.

TABLE 1

| Maximum Voltage @ Voltage Output (44) (V) | RMS Voltage @ Voltage Output (44) (V) | Load Line ($R_{LOAD}$) (Ω) | Supply Voltage @ Voltage Input (42) (V) | Efficiency of Charge Pump (50) | Overall efficiency of the Dual-mode ET Power Management Circuit (30) |
|---|---|---|---|---|---|
| 5.3 | 3.258 | 3.19 | 4.812 | 90.94% | 79.35% |
| 4.9 | 3.020 | 2.65 | 4.468 | 89.63% | 78.53% |
| 4.5 | 2.782 | 2.16 | 4.136 | 88.18% | 77.56% |

As shown in Table 1, when the supply voltage $V_{BAT}$ received by the ET amplifier 32 via the voltage input 42 changes from 4.812 V to 4.136 V, efficiency of the charge pump 50 is reduced by 2.76% and overall efficiency of the dual-mode ET power management circuit 30 is reduced by 1.79%. As such, the efficiency of the charge pump 50 and the overall efficiency of the dual-mode ET power management circuit 30 are not compromised beyond a common sense measure.

Those skilled in the art will recognize improvements and modifications to the embodiments of the present disclosure. All such improvements and modifications are considered within the scope of the concepts disclosed herein and the claims that follow.

What is claimed is:

1. A dual-mode envelope tracking (ET) power management circuit comprising:
    at least one ET amplifier coupled to the RF transmission circuit and having a preconfigured load line and configured to support a normal-power user equipment (NPUE) mode and a high-power user equipment (HPUE) mode, wherein:
        in the NPUE mode, the at least one ET amplifier is further configured to amplify at least one radio frequency (RF) signal to an NPUE voltage based on a supply voltage to cause the at least one RF signal being transmitted from an RF transmission circuit at an NPUE output power in an NPUE RF spectrum; and
        in the HPUE mode, the at least one ET amplifier is further configured to amplify the at least one RF signal to an HPUE voltage higher than the NPUE voltage based on a boosted supply voltage higher than the supply voltage to cause the at least one RF signal being transmitted from the RF transmission circuit at an HPUE output power higher than the NPUE output power in an HPUE RF spectrum; and
    a power management circuit configured to:
        provide the supply voltage to the at least one ET amplifier when the at least one ET amplifier operates in the NPUE mode; and
        provide the boosted supply voltage to the at least one ET amplifier when the at least one ET amplifier operates in the HPUE mode;
    wherein the preconfigured load line of the at least one ET amplifier is maintained constant to match an impedance of the RF transmission circuit between the NPUE mode and the HPUE mode.

2. The dual-mode ET power management circuit of claim 1 wherein the HPUE RF spectrum corresponds to long-term evolution (LTE) band forty-one.

3. The dual-mode ET power management circuit of claim 1 wherein the NPUE output power corresponds to power class three and the HPUE output power corresponds to power class two.

4. The dual-mode ET power management circuit of claim 1 wherein the boosted supply voltage is less than or equal to two times the supply voltage.

5. The dual-mode ET power management circuit of claim 1 wherein the at least one ET amplifier comprises:
    a voltage input configured to receive the supply voltage in the NPUE mode or the boosted supply voltage in the HPUE mode; and
    a voltage output configured to output the at least one RF signal at the NPUE voltage in the NPUE mode or output the at least one RF signal at the HPUE voltage in the HPUE mode.

6. The dual-mode ET power management circuit of claim 5 further comprising:

at least one offset capacitor provided between the voltage output of the at least one ET amplifier and a signal output coupled to the RF transmission circuit; and at least one charge pump configured to provide an electrical current to the signal output.

7. The dual-mode ET power management circuit of claim 6 wherein in the NPUE mode, the at least one ET amplifier is further configured to:

receive the supply voltage via the voltage input;

amplify the at least one RF signal to the NPUE voltage based on an NPUE look-up-table (LUT); and output the at least one RF signal at the NPUE voltage via the voltage output.

8. The dual-mode ET power management circuit of claim 7 wherein in the NPUE mode, the at least one offset capacitor is configured to increase the NPUE voltage by an offset voltage to provide an NPUE output voltage at the signal output, the NPUE output voltage and the electrical current provided by the at least one charge pump causing the at least one RF signal to be transmitted at the NPUE output power from the RF transmission circuit coupled to the signal output.

9. The dual-mode ET power management circuit of claim 8 wherein in the NPUE mode:

the NPUE output voltage is greater than or equal to an NPUE minimum output voltage and less than or equal to an NPUE maximum output voltage; and the supply voltage equals the NPUE maximum output voltage minus the offset voltage and plus a top headroom voltage.

10. The dual-mode ET power management circuit of claim 6 wherein in the HPUE mode, the at least one ET amplifier is further configured to:

receive the boosted supply voltage via the voltage input;

amplify the at least one RF signal to the HPUE voltage based on an HPUE look-up-table (LUT); and output the at least one RF signal at the HPUE voltage via the voltage output.

11. The dual-mode ET power management circuit of claim 10 wherein in the HPUE mode, the at least one offset capacitor is configured to increase the HPUE voltage by an offset voltage to provide an HPUE output voltage at the signal output, the HPUE output voltage and the electrical current provided by the at least one charge pump causing the at least one RF signal to be transmitted at the HPUE output power from the RF transmission circuit coupled to the signal output.

12. The dual-mode ET power management circuit of claim 11 wherein in the HPUE mode:

the HPUE output voltage is greater than or equal to an HPUE minimum output voltage and less than or equal to an HPUE maximum output voltage; and the boosted supply voltage equals the HPUE maximum output voltage minus the offset voltage and plus a top headroom voltage.

13. The dual-mode ET power management circuit of claim 12 wherein in the HPUE mode, the at least one ET amplifier is further configured to amplify the at least one RF signal to the HPUE voltage based on a clipped HPUE LUT generated by bottom clipping the HPUE LUT to increase the offset voltage.

14. The dual-mode ET power management circuit of claim 13 wherein in the HPUE mode, the clipped HPUE LUT causes the HPUE maximum output voltage to increase without increasing the boosted supply voltage.

15. The dual-mode ET power management circuit of claim 6 wherein:

the at least one ET amplifier comprises:

a first ET amplifier comprising a first voltage input and a first voltage output; and a second ET amplifier comprising a second voltage input and a second voltage output; and the at least one charge pump comprises:

a first charge pump coupled to the first ET amplifier, the first charge pump configured to generate a first boosted supply voltage; and a second charge pump coupled to the second ET amplifier, the second charge pump configured to generate a second boosted supply voltage;

wherein the first boosted supply voltage and the second boosted supply voltage are greater than the supply voltage and less than or equal to two times the supply voltage.

16. The dual-mode ET power management circuit of claim 15 wherein in the HPUE mode:

the first ET amplifier is configured to:

receive the boosted supply voltage via the first voltage input;

amplify at least one first RF signal to the HPUE voltage based on the boosted supply voltage; and output the at least one first RF signal at the HPUE voltage via the first voltage output; and the power management circuit is further configured to couple the second charge pump to the first voltage input of the first ET amplifier to provide the second boosted supply voltage to the first voltage input of the first ET amplifier as the boosted supply voltage.

17. The dual-mode ET power management circuit of claim 16 wherein the second ET amplifier is turned off.

18. The dual-mode ET power management circuit of claim 15 wherein in the HPUE mode:

the second ET amplifier is configured to:

receive the boosted supply voltage via the second voltage input;

amplify at least one second RF signal to the HPUE voltage based on the boosted supply voltage; and output the at least one second RF signal at the HPUE voltage via the second voltage output; and the power management circuit is further configured to couple the first charge pump to the second voltage input of the second ET amplifier to provide the first boosted supply voltage to the second voltage input of the second ET amplifier as the boosted supply voltage.

19. The dual-mode ET power management circuit of claim 18 wherein the first ET amplifier is turned off.

20. The dual-mode ET power management circuit of claim 1 configured to further increase the HPUE output power of the at least one RF signal in the HPUE mode by reducing insertion loss between the at least one ET amplifier and the RF transmission circuit.

* * * * *